United States Patent
Jiang et al.

(10) Patent No.: US 12,239,034 B2
(45) Date of Patent: *Feb. 25, 2025

(54) RESISTIVE RANDOM ACCESS MEMORY DEVICE HAVING NEEDLE-LIKE-SHAPED TOP ELECTRODE REGION AND METHOD FOR FABRICATING THE SAME

(71) Applicant: Taiwan Semiconductor Manufacturing Company, Ltd., Hsinchu (TW)

(72) Inventors: Jheng-Hong Jiang, Hsinchu (TW); Shing-Huang Wu, Hsinchu (TW); Chia-Wei Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 470 days.

This patent is subject to a terminal disclaimer.

(21) Appl. No.: 17/671,599

(22) Filed: Feb. 15, 2022

(65) Prior Publication Data

US 2023/0140134 A1    May 4, 2023

Related U.S. Application Data

(60) Provisional application No. 63/274,932, filed on Nov. 2, 2021.

(51) Int. Cl.
*H10N 70/00*    (2023.01)
*H10B 63/00*    (2023.01)

(52) U.S. Cl.
CPC ......... *H10N 70/8418* (2023.02); *H10B 63/30* (2023.02); *H10N 70/021* (2023.02)

(58) Field of Classification Search
CPC ........ H10B 63/00; H10B 63/10; H10B 63/30; H10B 63/80; H10N 70/021; H10N 70/066; H10N 70/24; H10N 70/253; H10N 70/801; H10N 70/826; H10N 70/8416; H10N 70/8418; H10N 70/881; H10N 70/8833
See application file for complete search history.

(56) References Cited

U.S. PATENT DOCUMENTS

2015/0357566 A1* 12/2015 Wang .................. H10N 70/841
257/4

* cited by examiner

*Primary Examiner* — Cheung Lee
(74) *Attorney, Agent, or Firm* — Kilpatrick Townsend & Stockton LLP (57) ABSTRACT

A RRAM device is provided. The RRAM device includes: a bottom electrode in a first dielectric layer; a switching layer in a second dielectric layer over the first dielectric layer, wherein a conductive path is formed in the switching layer when a forming voltage is applied; and a needle-like-shaped top electrode region in a third dielectric layer over the second dielectric layer. The needle-like-shaped top electrode region includes: an oxygen-rich dielectric layer, wherein a lower end of the oxygen-rich dielectric layer is a tip; and a top electrode over the oxygen-rich dielectric layer.

20 Claims, 9 Drawing Sheets

RESISTIVE RANDOM ACCESS MEMORY DEVICE HAVING NEEDLE-LIKE-SHAPED TOP ELECTRODE REGION AND METHOD FOR FABRICATING THE SAME

CROSS-REFERENCES TO RELATED APPLICATIONS

The present application claims priority to U.S. Provisional Patent Application No. 63/274,932, filed on Nov. 2, 2021, the entire disclosure of which is incorporated herein by reference.

FIELD

Embodiments of the present disclosure relate generally to memory devices, and more particularly to resistive random access memory (RRAM) devices.

BACKGROUND

In recent years, unconventional nonvolatile memory (NVM) devices, such as ferroelectric random access memory (FRAM) devices, phase-change random access memory (PRAM) devices, and resistive random access memory (RRAM) devices, have emerged. In particular, RRAM devices, which exhibit a switching behavior between a high resistance state (HRS) and a low resistance state (LRS), have various advantages over conventional NVM devices. Such advantages include, for example, compatible fabrication steps with current complementary-metal-oxide-semiconductor (CMOS) technologies, low-cost fabrication, a compact structure, flexible scalability, fast switching, high integration density, and so on. Moreover, RRAM implementations could be very useful hardware for running artificial intelligence (AI) and machine learning (ML) applications due to the increasing computational demands necessary for many improvements in AI and ML.

Therefore, there is a need to improve the performance of RRAM devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

Resistive random access memory (RRAM) is a type of nonvolatile memory (NVM) that works by changing the resistance across a dielectric solid-state material. RRAM devices are configured to store data by switching between different resistance states, for example, a high resistance state (HRS) and a low resistance state (LRS), corresponding to different data states.

To enable such "resistive switching," RRAM devices have a bottom electrode that is separated from a top electrode by a switching layer (sometimes referred to as a "data storage layer") having a variable resistance. The switching layer is a dielectric layer. Resistive switching allows for an RRAM device to change an electrical resistance of the switching layer between a high resistance state corresponding to a first data state (e.g., a "logic 0") and a low resistance state corresponding to a second data state (e.g., a "logic 1").

The switching layer typically comprises a high-κ dielectric material that is able to alter its internal resistance in response to an applied bias. There is a wide range of high-κ dielectric materials that can be used in RRAM devices. Different high-κ dielectric materials provide RRAM devices with different characteristics. For example, some high-κ dielectric materials may offer good endurance, while other high-κ dielectric materials may offer good data retention. Some examples of high-κ dielectric material include metal oxides such as aluminum oxide ($Al_2O_3$).

When a sufficiently high voltage (often referred to as "$V_{forming}$") is applied to the switching layer, oxygen ions move out of the switching layer, and the remaining oxygen vacancies form a conductive path (often referred to as a "filament") in the switching layer. The filament serves as a bridge between the top electrode and the bottom electrode, thus placing the RRAM device in the low resistance state (LRS). Once a filament is formed, it can be broken (referred to as the "reset" operation), resulting in the high resistance state (HRS), or regenerated (referred to as the "set" operation), resulting in the low resistance state (LRS).

There are, however, some challenges with the conventional RRAM devices. First, the filament generated has a large variation. The top electrode and the bottom electrode usually have comparable sizes. As a result, the filament can possibly occur at various locations and have various geometries. In some cases, there may be multiple filaments in the switching layer. In other words, the filament is not very predictable and cannot be controlled easily. The unpredictability negatively impacts the endurance and data retention in an RRAM device.

Second, the number of oxygen ions in an RRAM device usually decreases after frequent resistive switching operations. The oxygen ions in an RRAM device also diffuse, over time, into other regions due to a gradient in concentration. As the number of oxygen ions decreases, it becomes harder to break the filament (i.e., harder to reset the RRAM device). Accordingly, the endurance of the RRAM device is impacted by the loss of oxygen ions, and the data retention of the RRAM device deteriorates, limiting its usage in high-performance applications.

In accordance with some aspects of the disclosure, an improved top electrode and corresponding fabrication methods are introduced for addressing the aforementioned challenges resulted from the filament variations and the loss of oxygen ions. In some embodiment, a top electrode region is disposed in a dielectric layer. The top electrode region includes an oxygen-rich dielectric layer and a top electrode over the oxygen-rich dielectric layer. The oxygen-rich dielectric layer has a tapered shape. In one embodiment, the oxygen-rich dielectric layer has a needle-like shape. In one embodiment, the oxygen-rich dielectric layer has a tip located at the interface between the switching layer and the dielectric layer.

Due to the tapered shape or the needle-like shape of the top electrode region, a point discharge occurs when a filament is formed by applying a forming voltage to the top electrode. Since the tip has a large curvature, the electrical field around the tip is larger than that of a conventional top electrode, given the same voltage. As a result, it becomes easier to break down the switching layer to form the filament. The formation of the filament is more predictable and controllable. On the other hand, the oxygen-rich dielectric layer is a layer with a relatively high concentration of oxygen ions. In one embodiment, the oxygen-rich dielectric layer has a concentration of oxygen ions higher than a threshold concentration. As such, the oxygen-rich dielectric layer can have enough oxygen ions to compensate for the loss of oxygen ions after frequent switching operations. As a result, the endurance and data retention in the RRAM device is improved significantly.

Figure 1:
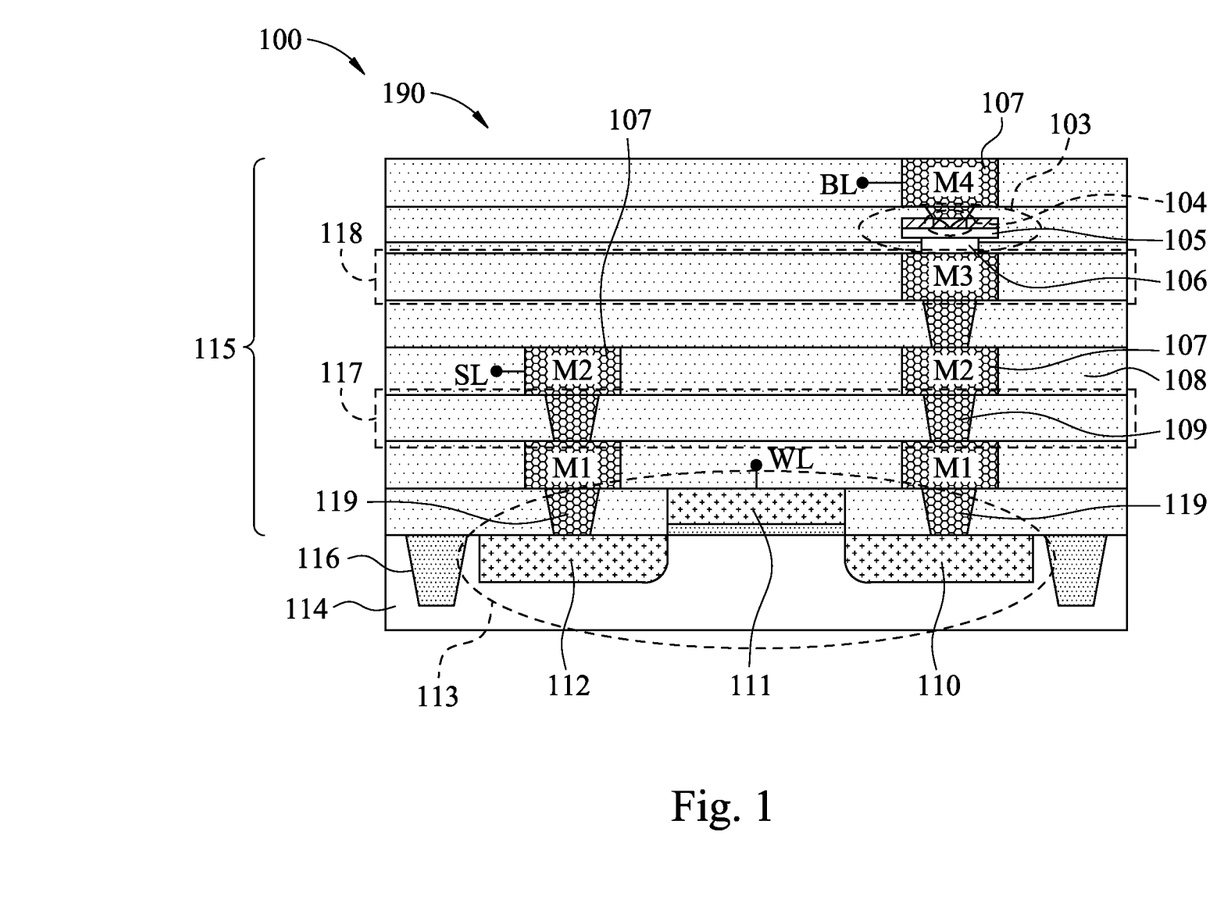
FIG. 1 is a diagram illustrating an example integrated circuit device including an RRAM device in accordance with some embodiments.

FIG. 1 is a diagram illustrating an example integrated circuit device 100 including an RRAM device 103 in accordance with some embodiments. In the illustrated example, the integrated circuit device 100 includes an RRAM cell 190, which includes the RRAM device 103 and an access transistor 113. The RRAM device 103 includes a tapered top electrode region 104 instead of a conventional top electrode to address the aforementioned challenges resulted from the filament variations and the loss of oxygen ions. In some embodiments, the tapered top electrode region 104 is a needle-like-shaped top electrode region 104. It should be noted that a needle-like shape is one example of a tapered shape, though the terms "needle-like-shaped" and "tapered" may be used interchangeably in the disclosure. The RRAM device 103 also includes a bottom electrode 106 and a switching layer 105 between the bottom electrode 106 and the top electrode region 104. As explained above, the electrical resistance of the switching layer 105 can be changed between a high resistance state (HRS) and a low resistance state (LRS). Details of the structure of the RRAM device 103 will be described below with reference to FIG. 2, whereas details of the fabrication of the RRAM device 103 will be described below with reference to FIGS. 3-4J.

In the illustrated example, the integrated circuit device 100 includes an interconnect structure 115 formed over a substrate 114. The substrate 114 may be, for example, a bulk substrate (e.g., a bulk silicon substrate) or a silicon-on-insulator (SOI) substrate. In some examples, the substrate 114 may also be a binary semiconductor substrate (e.g., GaAs), a ternary semiconductor substrate (e.g., AlGaAs), or a higher order semiconductor substrate. In the illustrated example, the substrate 114 includes shallow trench isolation (STI) regions 116 formed by filling trenches in the substrate 114 with dielectric. The interconnect structure 115 includes a plurality of inter-level dielectric (ILD) layers 117 interleaved with metallization layers 118. In the illustrated example, the ILD layers 117 include vias 109. In some implementations, dielectric 108 is, for example, low-κ dielectric, such as undoped silicate glass or an oxide, such as silicon dioxide or silicon carbide. The dielectric 108 may be an extremely low-κ dielectric, which may be a low-κ dielectric with porosity that reduces the overall dielectric constant. The metallization layers 118 include metal features 107 formed in trenches within the dielectric 108. The metal features 107 may include wires and vias. In some implementations, the metal features 107 in the metallization layers 118 and the vias 109 in the ILD layers 117 are made of a metal, such as copper or aluminum. The vias 109 electrically connect the metal features 107 across the metallization layers 118. The metallization layers 118 are commonly identified as the M1 metallization layer, the M2 metallization layer, the M3 metallization layer, and the M4 metallization layers, as shown in FIG. 1.

The access transistor 113, controlled by a word line (denoted as "WL") signal, turns on or turns off. When the access transistor 113 turns on, the RRAM device 103 becomes connected between a bit line (denoted as "BL") and a source line (denoted as "SL"). In a cell array including many RRAM cells 190 arranged in rows and columns, by selectively applying signals to word lines, bit lines, and source lines, the support circuitry (including a control logic, a word-line decoder, a bit-line decoder, a source-line decoder, a sensing circuitry, and the like) can perform the forming, set, reset, and read operations of the selected RRAM device 103. An example RRAM circuit will be described in detail below with reference to FIG. 5.

In the illustrated example, the access transistor 113 includes a source region 112 and a drain region 110 formed in the substrate 114 and a gate 111 formed over the substrate 114. It should be noted that the access transistor 113 is only one example and other types of transistors (e.g., FinFETs) are within the scope of the disclosure. Contacts 119 connect the source region 112 and drain region 110 to the lowest metallization layers (i.e., the M1 layer) 118. The contacts 119 may be made of a metal, such as copper or tungsten for example. As such, the source region 112 can be connected to the source line, whereas the drain region can be connected to the RRAM device 103. In the illustrated example, the word line is connected to the gate 111, the bit line is connected to a metal feature 107 in the M4 metallization layer 118, and the source line is connected to a metal feature 107 in the M2 metallization layer 118.

In the illustrated example, the integrated circuit device 100 has a one-transistor-one-resistor (1T1R) architecture. In some other embodiments, the access device is a diode instead of an access transistor, and the architecture is a one-diode-one-resistor (1D1R) architecture. In other embodiments, the access device is a bipolar junction transistor (BJT), and the architecture is a one-bipolar-junction-transistor-one-resistor (1BJT1R) architecture. In still other embodiments, the access device is a bipolar switch, and the architecture is a one-switch-one-resistor (1S1R) architecture.

Figure 2:
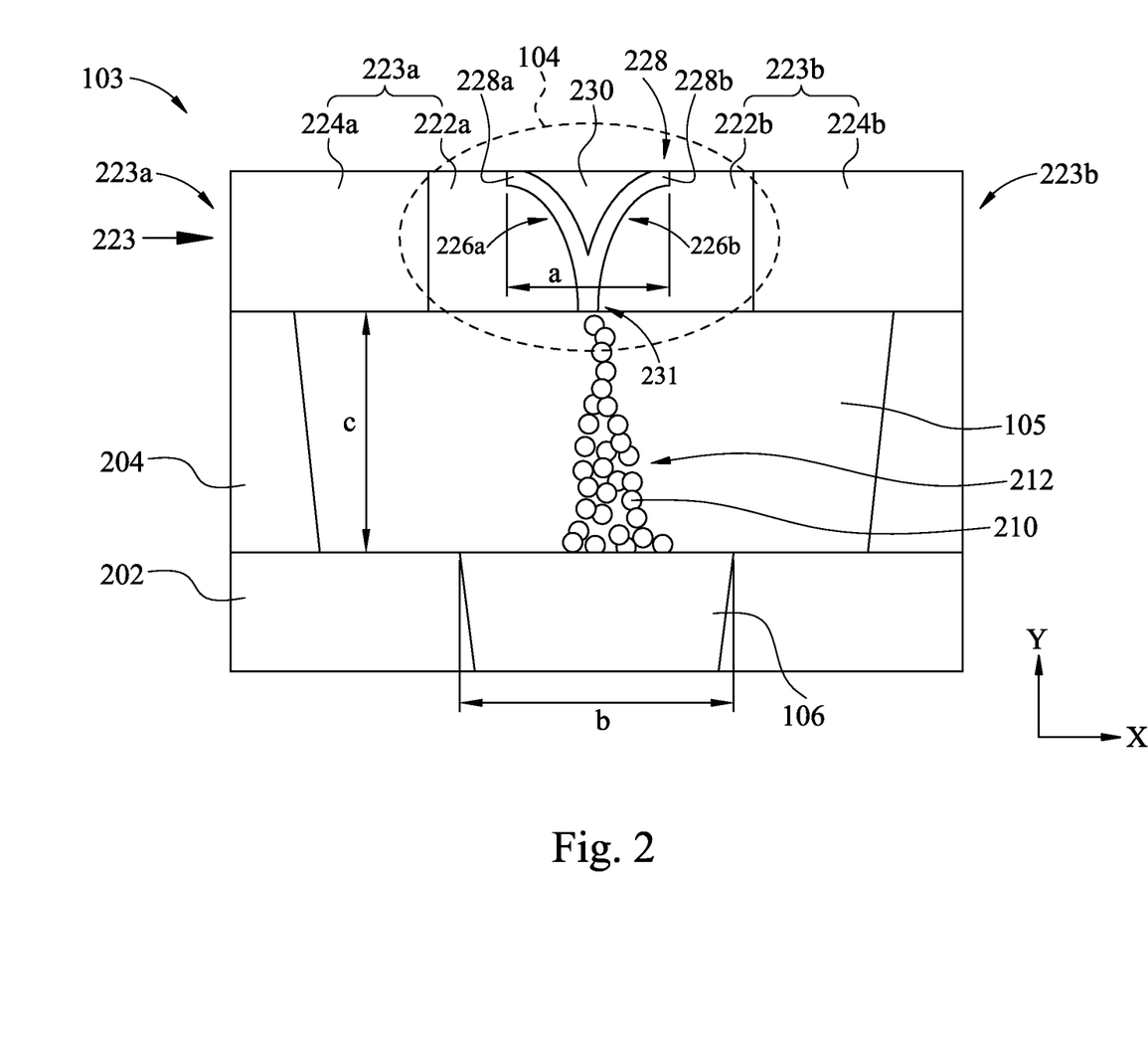
FIG. 2 is a diagram illustrating the example RRAM device shown in FIG. 1 in accordance with some embodiments.

FIG. 2 is a diagram illustrating the example RRAM device 103 shown in FIG. 1 in accordance with some embodiments. In the illustrated example, as mentioned above, the RRAM device 103 includes the bottom electrode 106, the switching layer 105, and the top electrode region 104. In the example shown in FIG. 1 and FIG. 2, the RRAM device 103 is formed between the M3 and M4 metallization layers 118. In other words, the bottom electrode 106 is connected to a metal feature in the M3 metallization layer 118, whereas the top electrode region 104 is connected to a metal feature in the M4 metallization layer 118. It should be noted that, in other examples, the RRAM device 103 may be formed between another adjacent pair of metallization layers 118, such as between the M4 and M5 metallization layers 118, or elsewhere within integrated circuit device 100.

The bottom electrode 106 is disposed in a first dielectric layer 202, whereas the switching layer is disposed in a second dielectric layer 204. The top electrode region 104 is disposed in a third dielectric layer 223. In one embodiment, the third dielectric layer 223 is made of a low-κ material such as silicon dioxide. It should be noted that the third dielectric layer 223 made of other low-κ materials are within the scope of the disclosure. The top electrode region 104 is situated between two dielectric regions 223a and 223b. The dielectric region 223a has a round corner 226a, whereas the dielectric region 223b has a round corner 226b. The round corners 226a and 226b are facing toward each other. As will be explained below with reference to FIGS. 3 and 4E-4G, the round corners 226a and 226b can be dummy spacers formed by a spacer-forming process in one implementation.

In the illustrated example, the top electrode region 104 includes an oxygen-rich dielectric layer 228 and a top electrode 230. The oxygen-rich dielectric layer 228 is sandwiched between the dielectric regions 223a and 223b and the top electrode 230. The oxygen-rich dielectric layer 228 has a left half 228a and a right half 228b. The left half 228a is formed on the round corner 226a, whereas the right half 228b is formed on the round corner 226b. As a result, the oxygen-rich dielectric layer 228 has a tapered shape. In one embodiment, the oxygen-rich dielectric layer 228 has a needle-like shape. The oxygen-rich dielectric layer 228 has a tip 231 located at the interface between the switching layer 105 and the third dielectric layer 223. The oxygen-rich dielectric layer 228 is pointing toward the switching layer 105. The top electrode 230 is formed on top of the oxygen-rich dielectric layer 228. As a result, the top electrode 230 also has a tapered shape. In one embodiment, the top electrode 230 has a needle-like shape. The oxygen-rich dielectric layer 228, the top electrode 230, and the top electrode region 104 tapers to the tip 231 located at the interface between the switching layer 105 and the third dielectric layer 223. In other words, the oxygen-rich dielectric layer 228, the top electrode 230, and the top electrode region 104 diminish in width in the horizontal direction (i.e., the X direction as shown in FIG. 2) downwardly in the vertical direction (i.e., the Z direction as shown in FIG. 2).

Due to the tapered shape or the needle-like shape of the top electrode region 104, a point discharge occurs when the filament 212 is formed by applying a forming voltage ($V_{forming}$) to the top electrode 230. In the illustrated example shown in FIG. 2, the filament 212 corresponds to remaining oxygen vacancies 210. Since the tip 231 has a large curvature, the electrical field around the tip 231 is larger than that of a conventional top electrode, given the same voltage. As a result, it becomes easier to break down the switching layer 105 to form the filament 212. In other words, it becomes easier to form the filament 212 between the tip 231 and the bottom electrode 106 than between a conventional electrode, which is a flat electrode, and the bottom electrode 106. Accordingly, the formation of the filament 212 is more predictable and controllable. As a result, the endurance and data retention in the RRAM device 103 is improved significantly.

On the other hand, the oxygen-rich dielectric layer 228 is a layer with a relatively high concentration of oxygen ions. In one embodiment, the oxygen-rich dielectric layer 228 has a concentration of oxygen ions higher than a threshold concentration. In one embodiment, the oxygen-rich dielectric layer 228 has a concentration of oxygen ions higher than that of the switching layer 105, if the oxygen-rich dielectric layer 228 and the switching layer 105 are made of the same material. As such, the oxygen-rich dielectric layer 228 can have enough oxygen ions to compensate for the loss of oxygen ions after frequent switching operations. The high concentration of oxygen ions makes the oxygen-rich dielectric layer 228 a good compensation source for the loss of oxygen ions after frequent switching operations. Accordingly, the endurance and the data retention of the RRAM device 103 are improved significantly.

As shown in FIG. 2, the top surface of the bottom electrode 106 has a width b in the X direction; the top surface of the top electrode region 104 has a width a in the X direction; the switching layer 105 has a height c in the Y direction; the oxygen-rich dielectric layer 228 has a thickness t. In one embodiment, the relationship between a and b is 0.001b≤a<b. In another embodiment, the relationship between a and b is 0.001b≤a<0.2b. In one embodiment, the relationship between c and a is c≥0.001a. In one embodiment, the relationship between c and b is c≥0.001b. In other words, the height c of the switching layer 105 is above certain thresholds. In one embodiment, the relationship between t and b is t≥0.001b. In one embodiment, the relationship between t and a is t≥0.001a. In other words, the thickness t of the oxygen-rich dielectric layer 228 is above certain thresholds.

Figure 3:
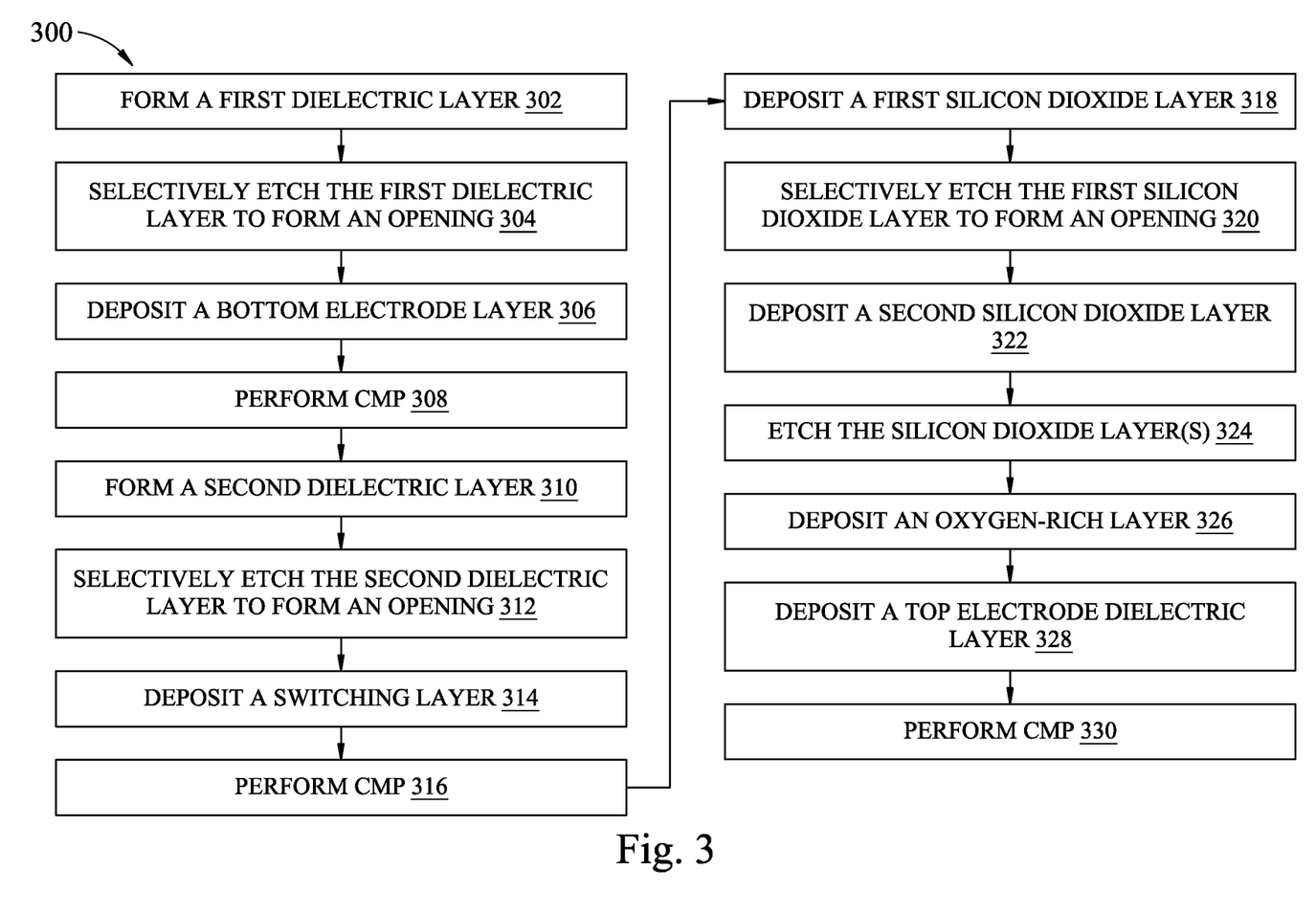
FIG. 3 is a diagram illustrating an example method of fabricating an RRAM device in accordance with some embodiments.
Figure 4A:
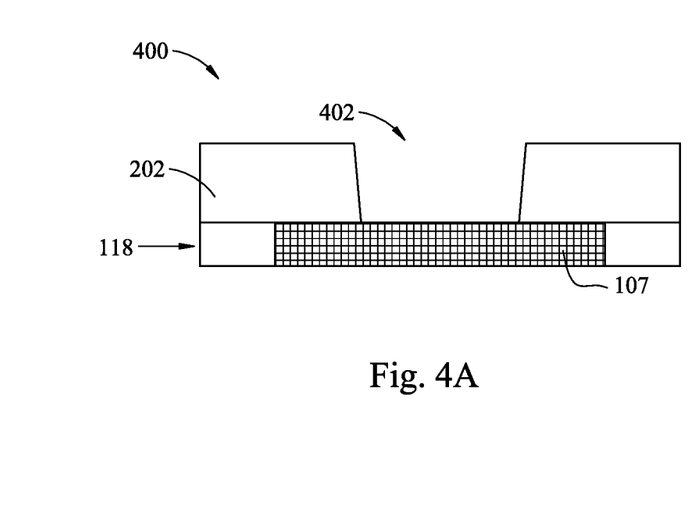
FIGS. 4A-4J are diagrams illustrating cross-sectional views of an RRAM device at various fabrication stages in accordance with some embodiments.
Figure 4B:
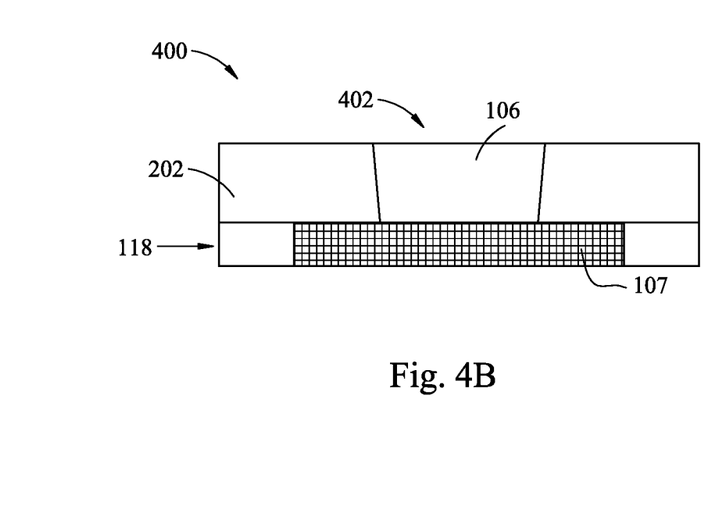
Figure 4C:
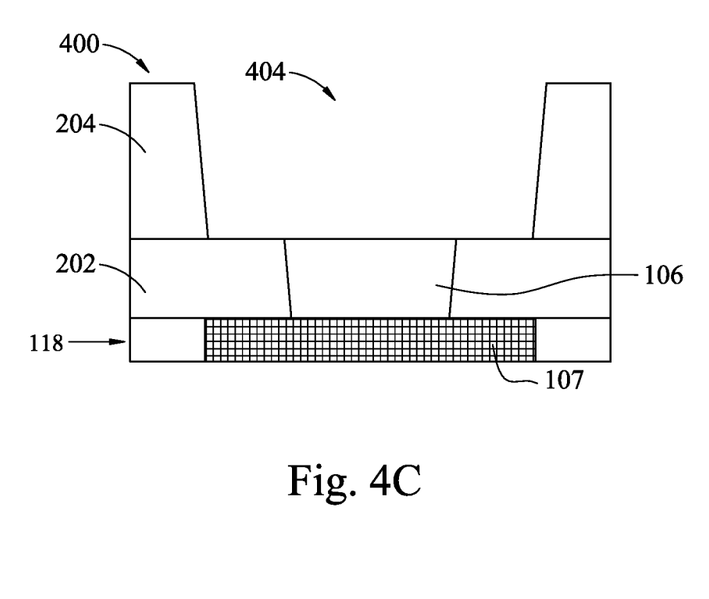
Figure 4D:
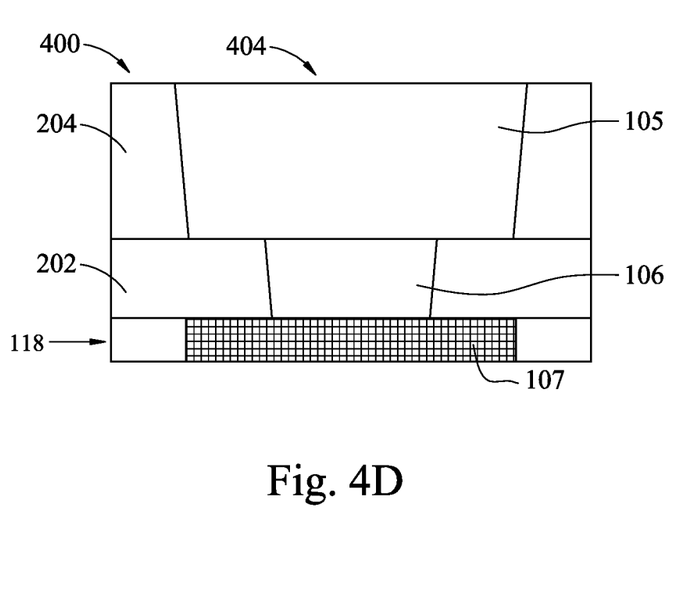
Figure 4E:
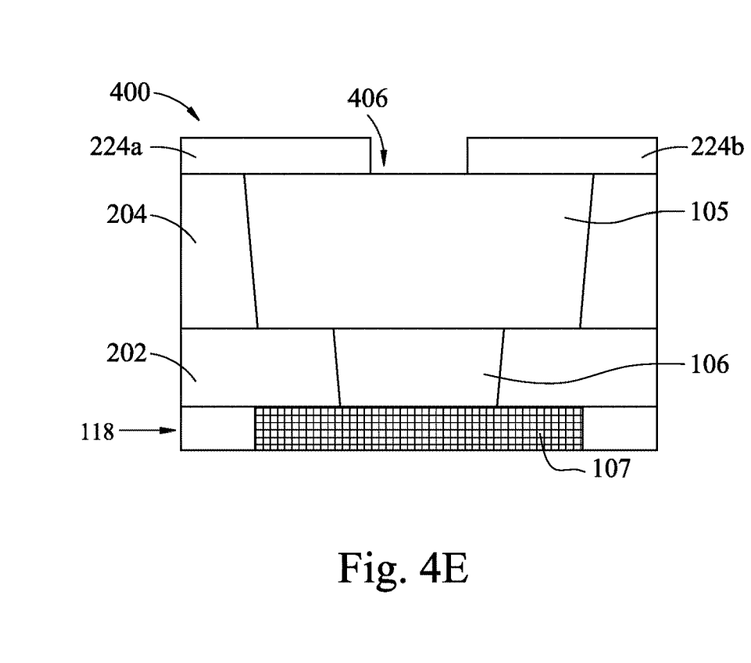
Figure 4F:
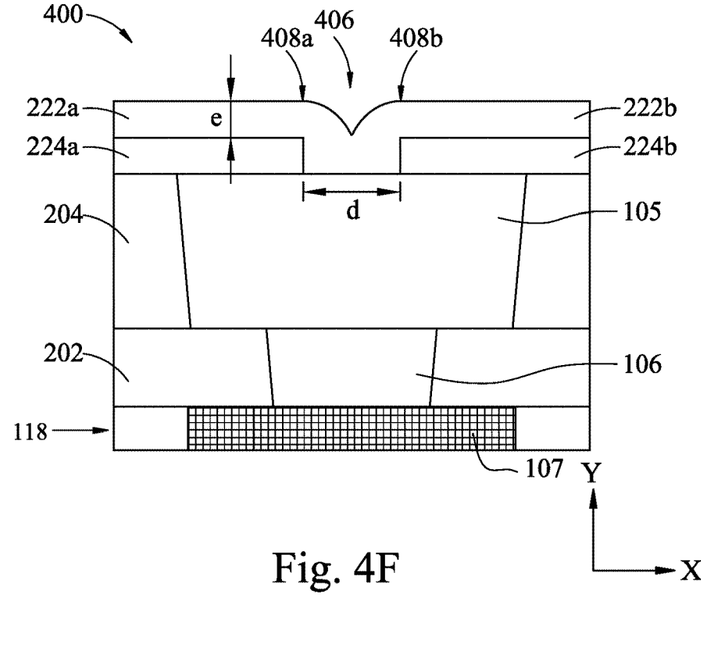
Figure 4G:
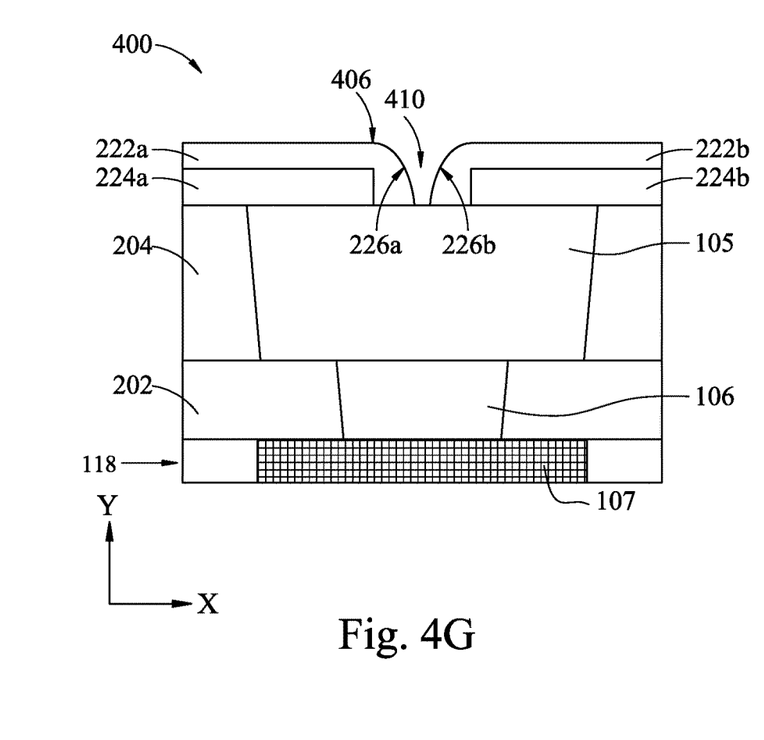
Figure 4H:
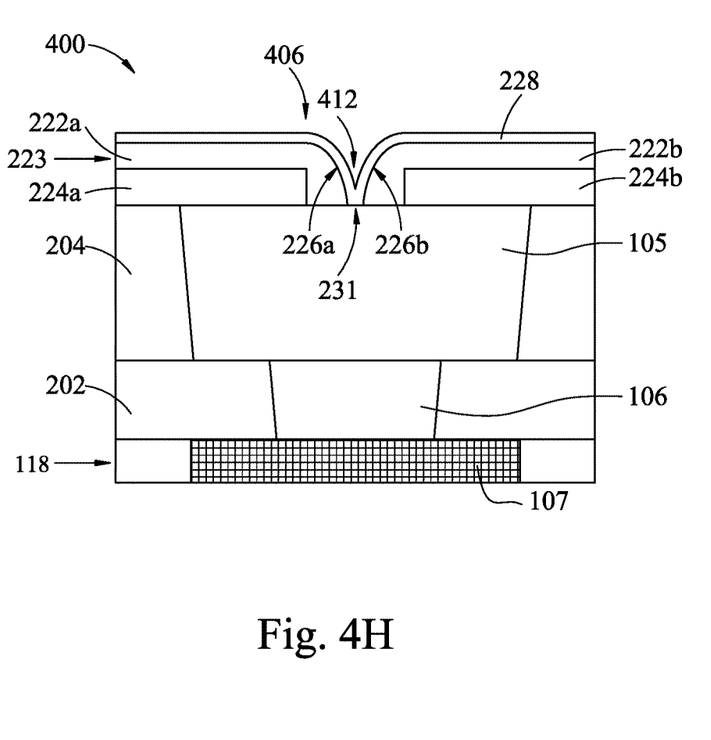
Figure 4I:
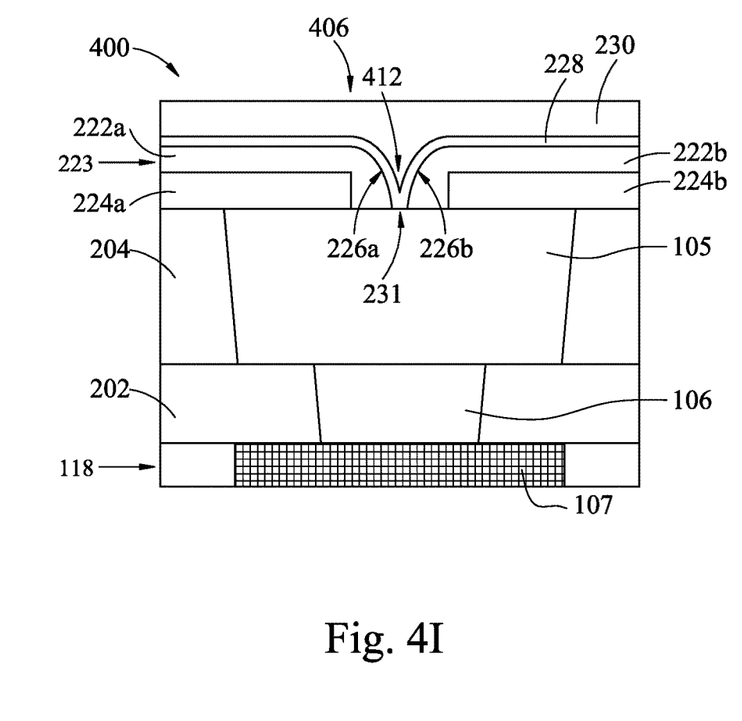
Figure 4J:
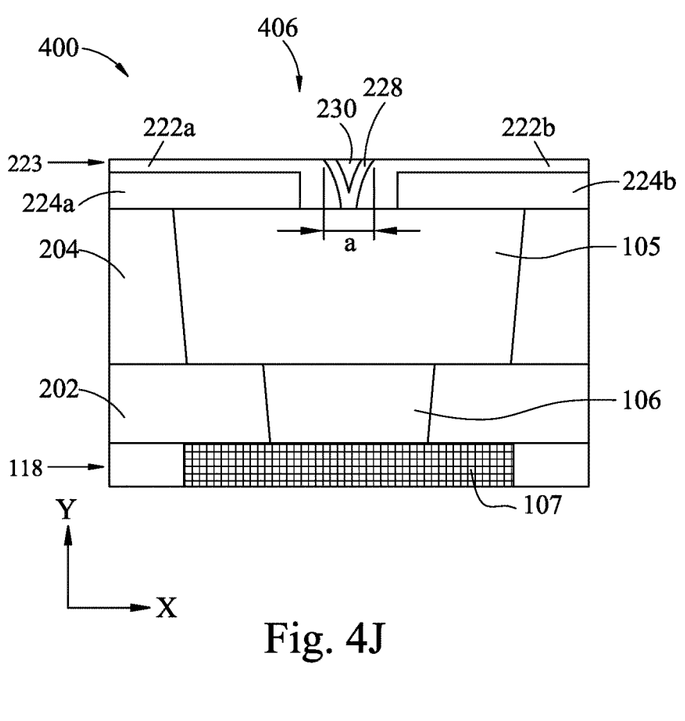

FIG. 3 is a diagram illustrating an example method 300 of fabricating an RRAM device in accordance with some embodiments. FIGS. 4A-4J are diagrams illustrating cross-sectional views of an RRAM device 400 at various fabrication stages in accordance with some embodiments. In some embodiments, the RRAM device 400 may be included in a microprocessor, memory cell, and/or other integrated circuits. Also, FIGS. 4A-4J are simplified for a better understanding of the concepts of the present disclosure. For example, although FIGS. 4A-4J illustrate the RRAM device 400, it is understood the integrated circuit, in which the RRAM device 400 is formed, may include a number of other devices including resistors, inductors, capacitors, fuses, and the like, which are not shown in FIGS. 4A-4J, for purposes of clarity of illustration.

The method 300 starts at operation 302. At operation 302, a first dielectric layer is formed. In one embodiment, a first dielectric layer is formed over a substrate. In another embodiment, a first dielectric layer is formed over a metallization layer. In the example shown in FIG. 4A, a first dielectric layer 202 is formed over a metallization layer 118 (e.g., a M3 metallization layer 118). The metallization layer 118 has a metal feature 107. The metal feature 107 is made of metal such as copper or aluminum. In some embodiments, the first dielectric layer 202 comprises silicon nitride (SiN), silicon carbide (SiC), or a similar composite dielectric film. In some embodiments, the first dielectric layer 202 may be formed by a deposition technique (e.g., physical vapor deposition (PVD), chemical vapor deposition (CVD), plasma-enhanced CVD (PECVD), atomic layer deposition (ALD), sputtering, etc.) to a predetermined thickness range.

The method 300 then proceeds to operation 304. At operation 304, the first dielectric layer is selectively etched to form an opening. In the example shown in FIG. 4A, an opening 402 is formed in the first dielectric layer 202, and the opening 402 is above the metal feature 107. As a result, a portion of the metal feature 107 is exposed. In one implementation, the opening 402 is formed by etching areas of the first dielectric layer 202 that are left exposed by a photoresist mask. In other implementations, the opening is formed by etching areas of the first dielectric layer 202 that are left exposed by a hard mask such as a nitride hard mask. In some implementations, the first dielectric layer 202 is selectively etched by wet etching. In other implementations, the first dielectric layer 202 is selectively etched by dry etching. In yet other implementations, the first dielectric layer 202 is selectively etched by plasma etching.

The method 300 then proceeds to operation 306. At operation 306, a bottom electrode layer is deposited. In one implementation, the bottom electrode layer is deposited using PVD. In one embodiment, the bottom electrode layer is made of a metal such as titanium (Ti), tantalum (Ta), aluminum (Al), copper (Cu), and tungsten (W). In another embodiment, the bottom electrode layer is made of a metal alloy such as an aluminum-copper (AlCu) alloy.

The method 300 then proceeds to operation 308. At operation 308, a chemical-mechanical planarization (CMP) process is performed. The CMP process is performed on the bottom electrode layer until the first dielectric layer is also polished out (i.e., exposed). In the example shown in FIG. 4B, the CMP process removes the portion of the bottom electrode layer that is outside the opening 402. Since the first dielectric layer 202 is polished out, the bottom electrode 106 is formed in the opening 402.

The method then proceeds to operation 310. At operation 310, a second electric layer is formed over the first dielectric layer. In some embodiments, the second electric layer and the first electric layer are made of the same material. In other embodiments, the second electric layer and the first electric layer are made of different materials. In some embodiments, the second dielectric layer comprises silicon nitride (SiN), silicon carbide (SiC), or a similar composite dielectric film. In some embodiments, the second dielectric layer may be formed by a deposition technique (e.g., PVD, CVD, PECVD, ALD, sputtering, etc.) to a predetermined thickness range.

The method 300 then proceeds to operation 312. At operation 312, the second dielectric layer is selectively etched to form an opening. In the example shown in FIG. 4C, an opening 404 is formed in the second dielectric layer 204, and the opening 404 is above the bottom electrode 106. As a result, the entire bottom electrode 106 is exposed. In one implementation, the opening 404 is formed by etching areas of the second dielectric layer 204 that are left exposed by a photoresist mask. In other implementations, the opening is formed by etching areas of the second dielectric layer 204 that are left exposed by a hard mask such as a nitride hard mask. In some implementations, the second dielectric layer 204 is selectively etched by wet etching. In other implementations, the second dielectric layer 204 is selectively etched by dry etching. In yet other implementations, the second dielectric layer 204 is selectively etched by plasma etching.

The method 300 then proceeds to operation 314. At operation 314, a switching layer is deposited. The switching layer is deposited using suitable techniques such as ALD and PVD. The switching layer may be made of various oxidation materials such as zirconium dioxide ($ZrO_2$), tantalum oxide (TaO), titanium dioxide ($TiO_2$), hafnium oxide ($HFO_2$), aluminum oxide ($Al_2O_3$), copper oxide (CuO), zinc oxide (ZnO), tungsten trioxide ($WO_3$), and the like.

The method 300 then proceeds to operation 316. At operation 316, a CMP process is performed. The CMP process is performed on the switching layer until the second dielectric layer is also polished out (i.e., exposed). In the example shown in FIG. 4D, the CMP process removes the portion of the switching layer that is outside the opening 404. Since the second dielectric layer 204 is polished out, the switching layer 105 is formed in the opening 404.

The method 300 then proceeds to operation 318. At operation 318, a first silicon dioxide layer is deposited. In one embodiment, the first silicon dioxide layer is deposited using PECVD. In another embodiment, the first silicon dioxide layer is deposited using thermal CVD. In yet another embodiment, the first silicon dioxide layer is deposited using ALD.

The method 300 then proceeds to operation 320. At operation 320, the first silicon dioxide layer is selectively etched to form an opening. In the example shown in FIG. 4E, an opening 406 is formed in the first silicon dioxide layer, and the opening 406 is above the switching layer 105. As a result, a portion of the switching layer 105 is exposed. After the opening 406 is formed, the remaining first silicon dioxide layer has two first silicon dioxide regions 224a and 224b on both sides of the opening 406. In one implementation, the opening 406 is formed by etching areas of the first silicon dioxide layer that are left exposed by a photoresist mask. In other implementations, the opening is formed by etching areas of the first silicon dioxide layer that are left exposed by a hard mask such as a nitride hard mask. In some implementations, the first dielectric layer 202 is selectively etched by wet etching. In other implementations, the first dielectric layer 202 is selectively etched by dry etching. In yet another implementation, the first dielectric layer 202 is selectively etched by plasma etching.

The method 300 then proceeds to operation 322. At operation 322, a second silicon dioxide layer is deposited. In one embodiment, the first silicon dioxide layer is deposited using PECVD. In another embodiment, the first silicon dioxide layer is deposited using thermal CVD. In yet another embodiment, the first silicon dioxide layer is deposited using ALD. In the example shown in FIG. 4F, because of the opening 406, the second silicon dioxide layer can have two spacer-like structures (may also be referred to as "dummy spacers") 408a and 408b formed in the opening 406. In one embodiment, the width d of the opening 406 in the X direction and the height e of the second silicon dioxide layer in the Y direction are chosen such that the spacer-like structures 408a and 408b are in contact with each other. In other words, there is no gap in the X direction between the spacer-like structures 408a and 408b. In the example shown in FIG. 4F, the second silicon dioxide layer can be regarded as two regions 222a and 222b.

The method 300 then proceeds to operation 324. At operation 324, the second silicon dioxide layer is etched. In one embodiment, the second silicon dioxide layer is etched such that a tapered opening is created. The tapered opening is sharp and diminishes in width in the X direction downwardly in the Z direction. In one embodiment, the tapered opening has a needle-like shape. In one embodiment, the lower end of the tapered opening in the Y direction is located at the upper surface of the switching layer. In the example shown in FIG. 4G, a tapered opening 410 is created in the middle of the opening 406. The lower end of the tapered opening 410 is located at the upper surface of the switching layer 105. The round corners 226a and 226b shown in FIG. 2 are formed. In some implementations, the second silicon dioxide layer is etched using dry etching. In some implementations, the second silicon dioxide layer is etched using wet etching following by dry etching. In some implementations, the etching process stops only when the switching layer 105 is detected (i.e., detection mode). In other implementations, the etching process stops after a predetermined time period (i.e., time mode). It should be noted that in some embodiments, the first silicon dioxide layer may also be etched after the second silicon dioxide layer over it has been etched. The RRAM device 103 shown in FIG. 2 is an example of this situation.

The method 300 then proceeds to operation 326. At operation 326, an oxygen-rich dielectric layer is deposited. In some implementations, the oxygen-rich dielectric layer is deposited using CVD. In other implementations, the oxygen-rich dielectric layer is deposited using ALD. The oxygen-rich dielectric layer may be made of various oxidation materials such as zirconium dioxide ($ZrO_2$), tantalum oxide (TaO), titanium dioxide ($TiO_2$), hafnium oxide ($HFO_2$), aluminum oxide ($Al_2O_3$), copper oxide (CuO), zinc oxide (ZnO), tungsten trioxide ($WO_3$), and the like. In the example shown in FIG. 4H, the oxygen-rich dielectric layer 228 is deposited over the second silicon dioxide regions 222a and 222b. The oxygen-rich dielectric layer 228 fills the needle-like-shaped opening 410 shown in FIG. 4G and covers the round corners 226a and 226b. As such, the oxygen-rich dielectric layer 228 that is located in the opening 406 has a needle-like shape. In one embodiment, the lower end of the oxygen-rich dielectric layer 228 is located at the upper surface of the switching layer 105. As such, the tip 231 is formed. The tip 231 is located at the interface between the switching layer 105 and the third dielectric layer 223. A needle-like-shaped opening 412 is formed.

The method 300 then proceeds to operation 328. At operation 328, a top electrode layer is deposited. In one implementation, the top electrode layer is deposited using PVD. In one embodiment, the top electrode layer is made of a metal such as titanium (Ti), tantalum (Ta), aluminum (Al), copper (Cu), and tungsten (W). In another embodiment, the top electrode layer is made of a metal alloy such as an aluminum-copper (AlCu) alloy. In the example shown in FIG. 4I, the top electrode layer 230 fills the needle-like-shaped opening 412.

The method 300 then proceeds to operation 330. At operation 330, a CMP process is performed. The CMP process is performed on the top electrode layer. In some embodiments, the CMP process is performed on the top electrode layer until the top surface of the third dielectric layer, which includes the first silicon dioxide layer and the second silicon dioxide layer on top of the first silicon dioxide layer, is polished out (i.e., exposed). In some embodiments, the CMP process is performed on the top electrode layer until the top surface of the top electrode region has a width a in the X direction smaller than a threshold width. In some embodiments, the CMP process is performed on the top electrode layer until the top surface of the top electrode region has a width a in the X direction as desired. In the example shown in FIG. 4J, the CMP process removes the portion of the top electrode layer that is outside the opening 406. The width a in the X direction of the top surface of the top electrode region can be controlled by adjusting the CMP depth in the Y direction.

Figure 5:
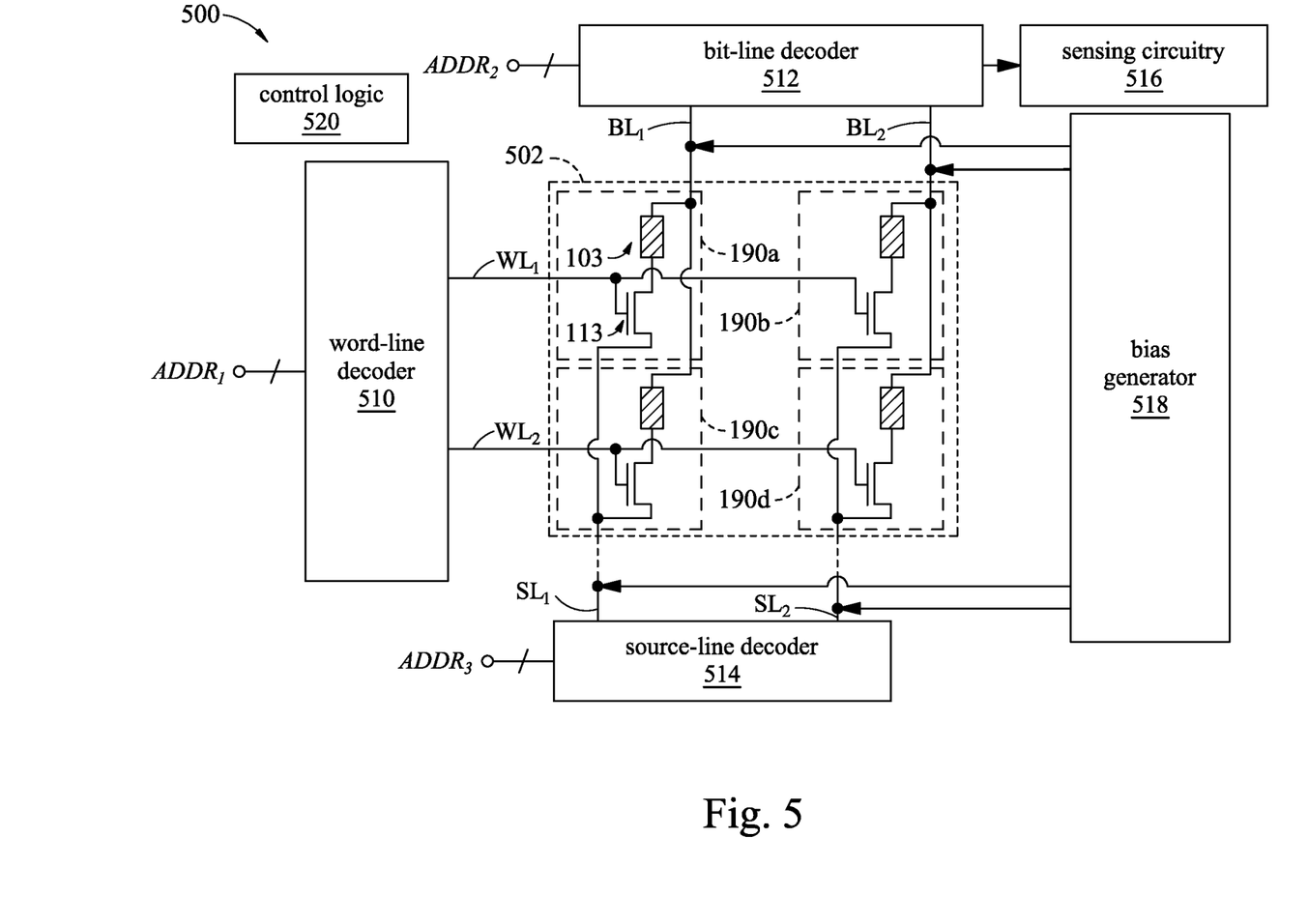
FIG. 5 is a diagram illustrating an example RRAM circuit having the RRAM cell shown in FIG. 1 in accordance with some embodiments.

FIG. 5 is a diagram illustrating an example RRAM circuit 500 having the RRAM cell 190 shown in FIG. 1 in accordance with some embodiments. It should be noted that RRAM device 103 shown in FIG. 2 can also be used in various applications such as logic circuits, light-emitting diode (LED) circuits, liquid crystal display (LCD) circuits, CMOS image sensor (CIS) circuits, and the like.

In the illustrated example, the RRAM circuit 500 includes, among other things, an RRAM cell array 502, a word-line decoder 510, a bit-line decoder 512, a source-line decoder 514, a sensing circuitry 516, a bias generator 518, and a control logic 520. The RRAM cell array 502 includes multiple RRAM cells 190 like the one shown in FIG. 1, and the multiple RRAM cells 190 are arranged in multiple rows and multiple columns.

In the example shown in FIG. 5, four RRAM cells 190 are arranged in two rows and two columns. The RRAM cells 190a and 190b in the first row are operably coupled to the word line WL1. The RRAM cells 190c and 190d in the second row are operably coupled to the word line WL2. The RRAM cells 190a and 190c in the first column are operably coupled to the bit line BL1 and the source line SL1. The RRAM cells 190b and 190d in the second column are operably coupled to the bit line BL2 and the source line SL2. The RRAM cells 190a, 190b, 190c, and 190d are respectively associated with an address defined by an intersection of a word line WL1 or WL2 and a bit line BL1 or BL2 and/or a source line SL1 or SL2.

Each of the RRAM cells 190a, 190b, 190c, and 190d includes the RRAM device 103 as shown in FIG. 1 and FIG. 2 and an access transistor 113 as shown in FIG. 1. The RRAM device 113 has a resistance state that is switchable between a low resistance state (LRS) and a high resistance state (HRS). The resistance states are indicative of a data value (e.g., a "1" or "0") stored within the RRAM device 103. The RRAM device 103 has a first terminal coupled to a bit line BL1 or BL2 and a second terminal coupled to its corresponding access transistor 113. The access transistor 113 has a gate coupled to a word line WL1 or WL2, a source coupled to a source line SL1 or SL2, and a drain coupled to the second terminal of the RRAM device 103. By activating the word line WL1 or WL2, the access transistor 113 is turned on, allowing for a source line SL1 or SL2 to be coupled to the second terminal of the RRAM device 103.

The RRAM cell array 502 is coupled to support circuitry that is configured to read data from and/or write data to the plurality of RRAM cells 190a, 190b, 190c, and 190d. In some embodiments, the support circuitry comprises the word-line decoder 510, the bit-line decoder 512, the source-line decoder 514, and the sensing circuitry 516. The word-line decoder 510 is configured to selectively apply a signal (e.g., a current and/or voltage) to one of the word lines WL1 and WL2 based upon a first address ADDR1; the bit-line decoder 512 is configured to selectively apply a signal to one of the plurality of bit lines BL1 and BL2 based upon a second address ADDR2; the source-line decoder 514 is configured to selectively apply a signal to one of the plurality of source lines SL1 and SL2 based upon a third address ADDR3. In some embodiments, the second address ADDR2 and the third address ADDR3 may be a same address.

By selectively applying signals to the word lines WL1 and WL2, the bit lines BL1 and BL2, and the source lines SL1 and SL2, the support circuitry is able to perform forming, set, reset, and read operations on selected ones of the plurality of RRAM cells 190a, 190b, 190c, and 190d. For example, to read data from the RRAM cell 190a, the word-line decoder 510 applies a signal (e.g., voltage) to the word line WL1, the bit-line decoder 512 applies a signal (e.g., voltage) to the bit line BL1, and the source-line decoder 514 applies a signal (e.g., voltage) to the source line SL1. The applied signals cause the sensing circuitry 516 to receive a signal (e.g., voltage) having a value that is dependent upon a data state of the RRAM cell 190a. The sensing circuitry 516 is configured to sense this signal and to determine the data state of the selected RRAM cell 190a based on the signal (e.g., by comparing a received voltage to a reference voltage).

The bias generator 518 is configured to provide various bias voltages for different components of the RRAM circuit 500. In the illustrated example, the bias generator 518 generates bias voltages for the bit lines BL1 and BL2 and the source lines SL1 and SL2. The control logic 520 is configured to control the functioning of the RRAM circuit 500.

In accordance with some aspects of the disclosure, a RRAM device is provided. The RRAM device includes: a bottom electrode in a first dielectric layer; a switching layer in a second dielectric layer over the first dielectric layer, wherein a conductive path is formed in the switching layer when a forming voltage is applied; and a needle-like-shaped top electrode region in a third dielectric layer over the second dielectric layer. The needle-like-shaped top electrode region includes: an oxygen-rich dielectric layer, wherein a lower end of the oxygen-rich dielectric layer is a tip; and a top electrode over the oxygen-rich dielectric layer.

In accordance with some aspects of the disclosure, a method of fabricating a RRAM device is provided. The method includes the following steps: forming a bottom electrode in a first dielectric layer; forming a switching layer in a second dielectric layer over the first dielectric layer; forming a needle-like-shaped opening in a third dielectric layer over the second dielectric layer; depositing an oxygen-rich dielectric layer over the third dielectric layer; and depositing a top electrode layer over the oxygen-rich dielectric layer.

In accordance with some aspects of the disclosure, A RRAM device is provided. The RRAM device includes: a bottom electrode in a first dielectric layer; a switching layer in a second dielectric layer over the first dielectric layer, wherein the switching layer has a low resistance state and a high resistance state in response to a voltage applied to the switching layer; a third dielectric layer over the second dielectric layer, wherein the third dielectric layer has a tapered opening over the switching layer; an oxygen-rich dielectric layer over the tapered opening; and a top electrode over the oxygen-rich dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A resistive random access memory (RRAM) device comprising:
    a bottom electrode in a first dielectric layer;
    a switching layer in a second dielectric layer over the first dielectric layer, wherein a conductive path is formed in the switching layer when a forming voltage is applied; and
    a needle-like-shaped top electrode region in a third dielectric layer over the second dielectric layer comprising:
        an oxygen-rich dielectric layer, wherein a lower end of the oxygen-rich dielectric layer is a tip; and
        a top electrode over the oxygen-rich dielectric layer.

2. The RRAM device of claim 1, wherein the tip is in contact with the switching layer.

3. The RRAM device of claim 1, wherein a first width of a top surface of the needle-like-shaped top electrode region in a horizontal direction is smaller than a second width of a top surface of the bottom electrode.

4. The RRAM device of claim 1, wherein the oxygen-rich dielectric layer is over a needle-like-shaped opening in the third dielectric layer.

5. The RRAM device of claim 4, wherein the needle-like-shaped opening is defined by two round corners and facing toward each other.

6. The RRAM device of claim 5, wherein the two round corners are located in an opening in the third dielectric layer.

7. The RRAM device of claim 5, wherein the two round corners are dummy spacers.

8. The RRAM device of claim 1, wherein the switching layer is made of a first oxidation material.

9. The RRAM device of claim 8, wherein the oxygen-rich dielectric layer is made of a second oxidation material.

10. The RRAM device of claim 9, wherein the oxygen-rich dielectric layer has a concentration of oxygen ions higher than a threshold concentration.

11. The RRAM device of claim 9, wherein the oxygen-rich dielectric layer has a concentration of oxygen ions higher than a concentration of oxygen ions in the switching layer.

12. A method of fabricating a resistive random access memory (RRAM) device comprising:
    forming a bottom electrode in a first dielectric layer;
    forming a switching layer in a second dielectric layer over the first dielectric layer;
    forming a needle-like-shaped opening in a third dielectric layer over the second dielectric layer;
    depositing an oxygen-rich dielectric layer over the third dielectric layer; and
    depositing a top electrode layer over the oxygen-rich dielectric layer.

13. The method of claim 12 further comprising:
   polishing the top electrode layer and the oxygen-rich dielectric layer.

14. The method of claim 13, wherein the polishing continues until there is no oxygen-rich dielectric layer outside the needle-like-shaped opening.

15. The method of claim 12, wherein the forming the needle-like-shaped opening in the third dielectric layer comprises:
   depositing a first silicon dioxide layer over the second dielectric layer;
   forming an opening in the first silicon dioxide layer;
   depositing a second silicon dioxide layer over the first silicon dioxide layer; and
   etching the second silicon dioxide layer.

16. The method of claim 12, wherein the oxygen-rich dielectric layer has a tip in contact with the switching layer.

17. The method of claim 12, wherein the oxygen-rich dielectric layer has a concentration of oxygen ions higher than a threshold concentration.

18. A resistive random access memory (RRAM) device comprising:
   a bottom electrode in a first dielectric layer;
   a switching layer in a second dielectric layer over the first dielectric layer, wherein the switching layer has a low resistance state and a high resistance state in response to a voltage applied to the switching layer;
   a third dielectric layer over the second dielectric layer, wherein the third dielectric layer has a tapered opening over the switching layer;
   an oxygen-rich dielectric layer over the tapered opening; and
   a top electrode over the oxygen-rich dielectric layer.

19. The RRAM device of claim 18, wherein the oxygen-rich dielectric layer has a tip in contact with the switching layer.

20. The RRAM device of claim 18, wherein the tapered opening is defined by two dummy spacers facing toward each other.

\* \* \* \* \*